US009728675B2

(12) United States Patent
Jung et al.

(10) Patent No.: US 9,728,675 B2
(45) Date of Patent: Aug. 8, 2017

(54) DISPLAY SUBSTRATE, METHOD OF MANUFACTURING THE SAME AND ELECTRO-WETTING DISPLAY PANEL HAVING THE SAME

(71) Applicant: Amazon Technologies, Inc., Seattle, WA (US)

(72) Inventors: Suk-Won Jung, Goyang-si (KR); Seung-Mi Seo, Hwaseong-si (KR); Sung-Hoon Yang, Seoul (KR)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 13/835,103

(22) Filed: Mar. 15, 2013

(65) Prior Publication Data
US 2014/0061681 A1    Mar. 6, 2014

(30) Foreign Application Priority Data
Sep. 5, 2012    (KR) .................. 10-2012-0098288

(51) Int. Cl.
*H01L 33/08*    (2010.01)
*G02B 26/00*    (2006.01)
*H01L 27/12*    (2006.01)

(52) U.S. Cl.
CPC ............ *H01L 33/08* (2013.01); *G02B 26/005* (2013.01); *H01L 27/1248* (2013.01)

(58) Field of Classification Search
CPC . H01L 33/08; H01L 27/1214; H01L 51/5237; G02B 26/005

USPC .......... 257/88, 40, 81, E51.006; 359/485.01; 438/34
See application file for complete search history.

(56) References Cited

U.S. PATENT DOCUMENTS

| | | | | |
|---|---|---|---|---|
| 2006/0082299 A1* | 4/2006 | Yang | ................. | H01L 51/5237 313/512 |
| 2007/0097278 A1* | 5/2007 | Rho | .................... | G02F 1/13338 349/12 |
| 2008/0063949 A1* | 3/2008 | Inoue | .................. | H01L 27/3246 430/5 |
| 2009/0046231 A1* | 2/2009 | Lu | ....................... | G02B 26/004 349/139 |
| 2009/0115318 A1* | 5/2009 | Gregory | ............. | H01L 27/3246 313/504 |
| 2010/0134731 A1* | 6/2010 | Jeon | ..................... | G02F 1/13624 349/110 |

(Continued)

FOREIGN PATENT DOCUMENTS

| | | |
|---|---|---|
| KR | 1020070020649 A | 2/2007 |
| KR | 1020110040462 A | 4/2011 |

*Primary Examiner* — David Vu
*Assistant Examiner* — Mouloucoulaye Inoussa
(74) *Attorney, Agent, or Firm* — Lee & Hayes, PLLC

(57) ABSTRACT

In a display substrate, a method for manufacturing the display substrate and an electro-wetting display apparatus including the display substrate, the display substrate includes a base substrate, a sidewall defining a unit pixel area, a pixel electrode, a hydrophobic insulating layer and a light blocking layer. The sidewall is on the base substrate and defines the unit pixel area. The pixel electrode is in the unit pixel area. The hydrophobic insulating layer is on the sidewall and the pixel electrode. The light blocking layer is on the hydrophobic insulating layer and overlaps the sidewall.

20 Claims, 17 Drawing Sheets

(56) References Cited

U.S. PATENT DOCUMENTS

| | | | |
|---|---|---|---|
| 2010/0195190 A1* | 8/2010 | Ishioka | G02B 26/004 359/316 |
| 2010/0245408 A1 | 9/2010 | Matsuoka et al. | |
| 2010/0321617 A1* | 12/2010 | Jeon et al. | 349/110 |
| 2011/0001138 A1* | 1/2011 | Huang | H01L 27/1214 257/59 |
| 2011/0181952 A1* | 7/2011 | Kim | G02B 26/004 359/485.01 |
| 2012/0243071 A1* | 9/2012 | Lee | G02B 26/005 359/290 |
| 2013/0271816 A1* | 10/2013 | Shim et al. | 359/290 |
| 2013/0329274 A1* | 12/2013 | Yang | G02B 26/005 359/290 |

\* cited by examiner

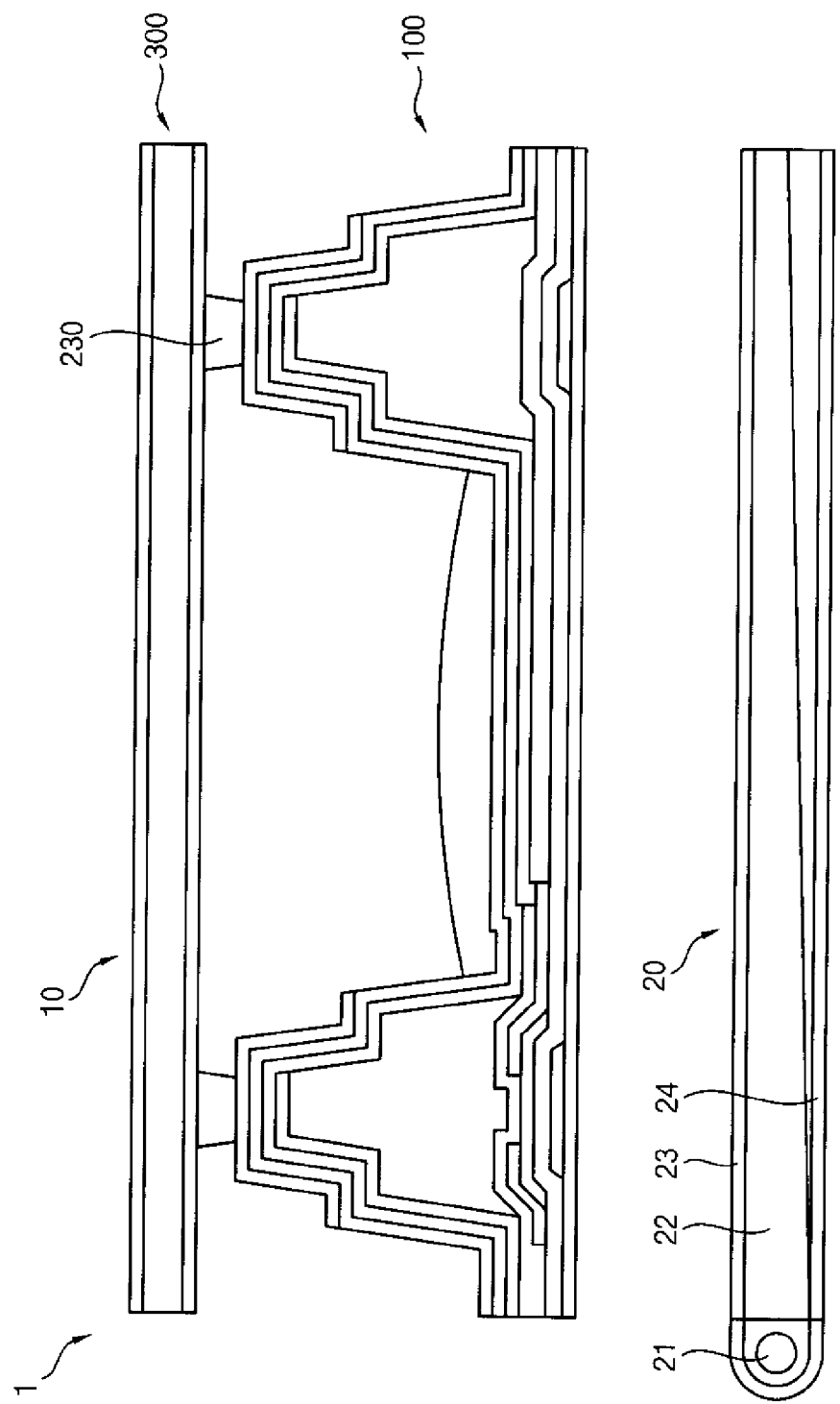

DISPLAY SUBSTRATE, METHOD OF MANUFACTURING THE SAME AND ELECTRO-WETTING DISPLAY PANEL HAVING THE SAME

This application claims priority to Korean Patent Application No. 10-2012-0098288, filed on Sep. 5, 2012, and all the benefits accruing therefrom under 35 U.S.C. §119, the contents of which in its entirety is herein incorporated by reference.

BACKGROUND

1. Field

Exemplary embodiments of the invention relate to a display substrate, a method of manufacturing the display substrate, and an electro-wetting display panel having the display substrate. More particularly, exemplary embodiments of the invention relate to a display substrate used for an electro-wetting display apparatus, a method of manufacturing the display substrate, and an electro-wetting display panel having the display substrate.

2. Description of the Related Art

In an electro-wetting display panel, a hydrophobic insulating layer is coated on an electrode, and a conductive fluid (water) and a non-conductive fluid (oil) are disposed on the hydrophobic insulating layer. A voltage is applied to the electrode and the conductive fluid to control characteristics of a surface of the hydrophobic insulating layer. Thus, a contact angle of the conductive fluid and an interfacial shape between the conductive fluid and the non-conductive fluid are changed.

An electro-wetting display apparatus using the above-mentioned electro-wetting display panel has enhanced transmittance and reflectance, decreases a cost and power consumption, and increases a response velocity.

However, in the electro-wetting display apparatus, a sidewall is used to prevent the non-conductive fluid from overflowing to an adjacent pixel due to a change of the interface between the conductive fluid and the non-conductive fluid. To form the sidewall on the hydrophobic insulating layer, plasma is applied to the hydrophobic insulating layer and an additional process is performed to recover a hydrophobicity characteristic of the hydrophobic insulating layer damaged due to the applied plasma. However, the additional process undesirably makes an entire process of manufacturing the electro-wetting display apparatus more complicated, and the hydrophobicity of the hydrophobic insulating layer is not entirely recovered. Therefore, there remains a need for an improved electro-wetting display apparatus which has a simplified manufacturing process and maintains hydrophobic characteristics of the hydrophobic insulating layer during such manufacturing process.

SUMMARY

One or more exemplary embodiment of the invention provides a display substrate having a sidewall formed via a relatively simple process.

One or more exemplary embodiment of the invention also provides a method for manufacturing the display substrate.

One or more exemplary embodiment of the invention also provides an electro-wetting display panel having the display substrate.

In an exemplary embodiment of a display substrate according to the invention, the display substrate includes a base substrate, a sidewall, a pixel electrode, a hydrophobic insulating layer and a light blocking layer. The sidewall is on the base substrate and defines a unit pixel area. The pixel electrode is in the unit pixel area. The hydrophobic insulating layer is on the sidewall and the pixel electrode. The light blocking layer is on the hydrophobic insulating layer and overlaps the sidewall.

In an exemplary embodiment, the display substrate may further include a switching element. The switching element may be electrically connected to gate line, a data line crossing the gate line and the pixel electrode. The sidewall may overlap the gate line, the data line and the switching element.

In an exemplary embodiment, the hydrophobic insulating layer may include a barrier layer on the sidewall and the pixel electrode, and a hydrophobic layer on the barrier layer.

In an exemplary embodiment, the barrier layer may include silicon oxide (SiOx) or silicon nitride (SiNx).

In an exemplary embodiment, the sidewall may include an organic material, and the light blocking layer may include a metal or a metal oxide.

In an exemplary embodiment, the light blocking layer may overlap an upper surface of the sidewall.

In an exemplary embodiment, the pixel electrode may be on a side surface of the sidewall or the upper surface of the sidewall.

In an exemplary embodiment, the sidewall may include a first sidewall portion and a second sidewall portion. The first sidewall portion may be on the base substrate. The second sidewall portion may be on the first sidewall portion, and form a stepped portion with the first sidewall portion.

In an exemplary embodiment, the light blocking layer may be on an upper surface of the first sidewall portion, a side surface of the second sidewall portion and an upper surface of the second sidewall portion.

In an exemplary embodiment, the pixel electrode may be on a side surface of the first sidewall portion, an upper surface of the first sidewall portion, a side surface of the second sidewall portion and an upper surface of the second sidewall portion.

In an exemplary embodiment of a method for manufacturing a display substrate according to the invention, the method includes providing a sidewall on a base substrate, the sidewall defining a unit pixel area, providing a pixel electrode in the unit pixel area, providing a hydrophobic insulating layer on the sidewall and the pixel electrode, and providing a light blocking layer on the hydrophobic insulating layer and overlapping the sidewall.

In an exemplary embodiment, the providing a sidewall may include providing an organic layer on the base substrate including a gate line, a data line crossing the gate line, and a switching element, and patterning the organic layer to form the sidewall overlapping the gate line, the data line and the switching element.

In an exemplary embodiment, the providing a light blocking layer may include providing a metal layer on the hydrophobic insulating layer, and patterning the metal layer to form a light blocking layer overlapping an upper surface of the sidewall.

In an exemplary embodiment, the providing a pixel electrode may include providing an electrode layer on the base substrate including the sidewall, and patterning the electrode layer to form the pixel electrode on a side surface of the sidewall or an upper surface of the sidewall, and electrically connected to the switching element.

In an exemplary embodiment, the patterning the organic layer may include using a slit mask or a half-tone mask to form the sidewall including a stepped portion.

In an exemplary embodiment, the providing a the light blocking layer may include providing a metal layer on the hydrophobic insulating layer, and patterning the metal layer to form the light blocking layer overlapping the stepped portion of the sidewall and an upper surface of the sidewall.

In an exemplary embodiment, the providing a pixel electrode may include providing an electrode layer on the base substrate including the sidewall, and patterning the electrode layer to form the pixel electrode on a side surface of the sidewall including the stepped portion and an upper surface of the sidewall including the stepped portion, and electrically connected to a drain electrode of the switching element.

In an exemplary embodiment, the providing a hydrophobic insulating layer may include providing a barrier layer on the sidewall and the pixel electrode, and providing a hydrophobic layer on the barrier layer.

In an exemplary embodiment of an electro-wetting display apparatus according to the invention, the electro-wetting display apparatus includes a display substrate, an opposite substrate and a fluidic layer. The display substrate includes a base substrate, a sidewall, a pixel electrode, a hydrophobic insulating layer and a light blocking layer. The sidewall is on the base substrate and defines a unit pixel area. The pixel electrode is in the unit pixel area. The hydrophobic insulating layer is on the sidewall and the pixel electrode. The light blocking layer is on the hydrophobic insulating layer and overlaps the sidewall. The opposite substrate faces the display substrate. The fluidic layer is between the display substrate and the opposite substrate, and includes first and second fluids having specific gravities different from each other.

In an exemplary embodiment, the electro-wetting display apparatus further includes a column spacer between the light blocking layer and the opposite substrate, and maintains a cell gap between the display substrate and the opposite substrate.

According to one or more exemplary embodiment of the invention, a hydrophobic insulating layer is on a sidewall of a display substrate, and thus a plasma applying process and a recovery process may be omitted in forming the display substrate, compared with a conventional display substrate including the sidewall on the hydrophobic insulating layer. Thus, one or more exemplary embodiment of the processes of forming the electro-wetting display panel of according to the invention may be more efficient.

In addition, since the recovery process may be omitted in one or more exemplary embodiment of the invention, a decrease in the hydrophobicity of the hydrophobic insulating layer due to the recovery process may be reduced or effectively prevented.

In addition, within one more exemplary embodiment of the electro-wetting display panel, a light blocking layer having hydrophilicity is on and extends along the sidewall, and thus overflowing of the light blocking layer of a non-conductive fluid (for example, an oil) may be reduced or effectively prevented. In one exemplary embodiment, for example, in injecting the non-conductive fluid into a unit pixel area of the electro-wetting display apparatus or driving the electro-wetting display apparatus, movement of the non-conductive fluid into an adjacent unit pixel area may be reduced or effectively prevented.

In addition, a pixel electrode extends to a side surface of the sidewall and not along the sidewall, and thus the non-conductive fluid may more accurately move toward a portion of the sidewall excluding the pixel electrode. Thus, movement of the non-conductive fluid may be better controlled and malfunction of the electro-wetting display apparatus may be reduced or effectively prevented.

BRIEF DESCRIPTION OF THE DRAWINGS

The above and other features and advantages of the invention will become more apparent by describing in detailed exemplary embodiments thereof with reference to the accompanying drawings, in which:

FIG. 5 is a cross-sectional view illustrating an exemplary embodiment of an electro-wetting display apparatus having the electro-wetting display panel of FIG. 1;

DETAILED DESCRIPTION

Figure 1:
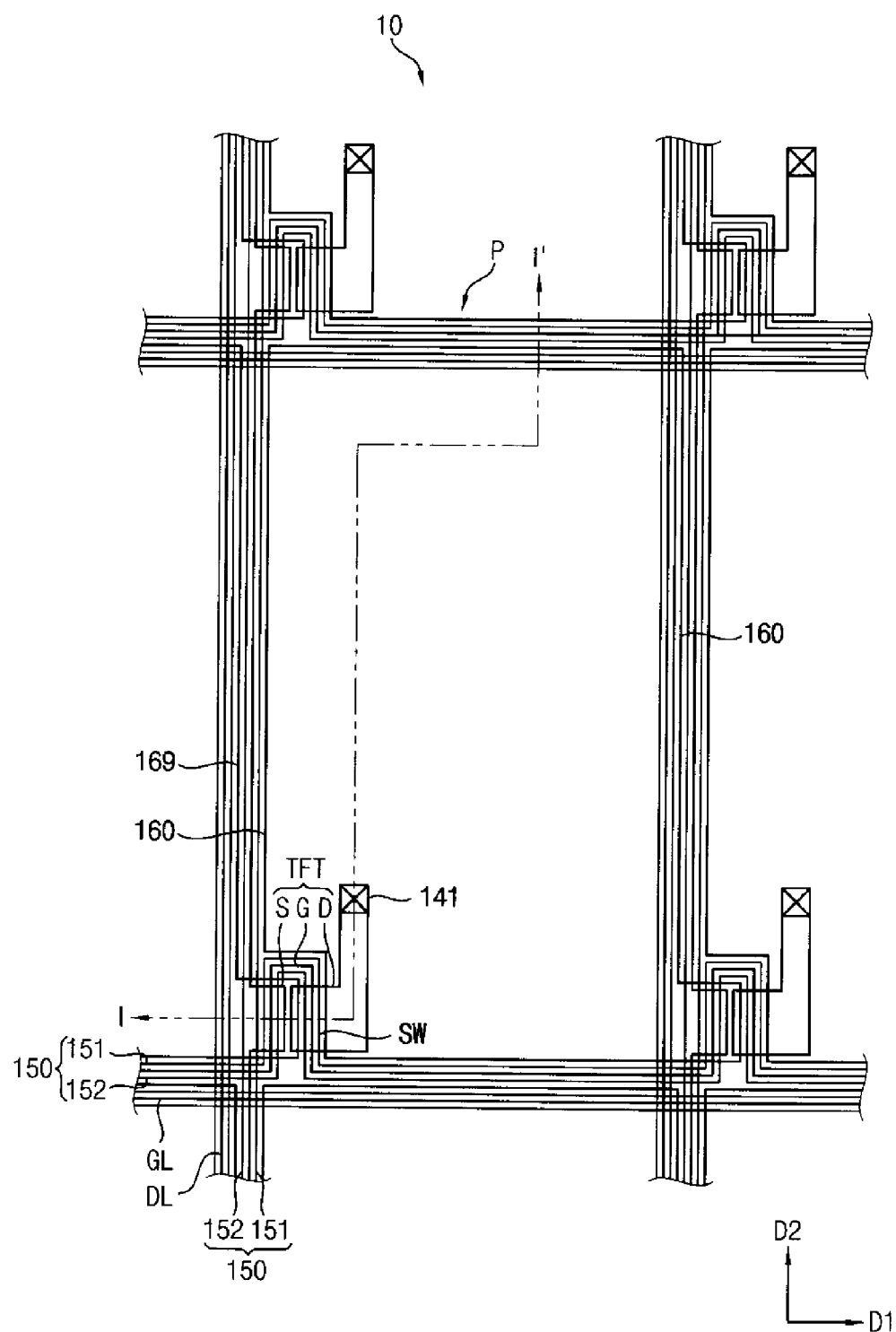
FIG. 1 is a plan view illustrating an exemplary embodiment of an electro-wetting display panel according to the invention.

It will be understood that when an element or layer is referred to as being "on" or "coupled to" another element or layer, the element or layer can be directly on or connected to another element or layer or intervening elements or layers. In contrast, when an element is referred to as being "directly on" or "directly connected to" another element or layer, there are no intervening elements or layers present. As used herein, connected may refer to elements being physically and/or electrically connected to each other. Like numbers refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "lower," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "lower" relative to other elements or features would then be oriented "upper" relative to the other elements or features. Thus, the exemplary term "lower" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of stated features, integers, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, exemplary embodiments of the invention will be described in further detail with reference to the accompanying drawings.

Figure 2:
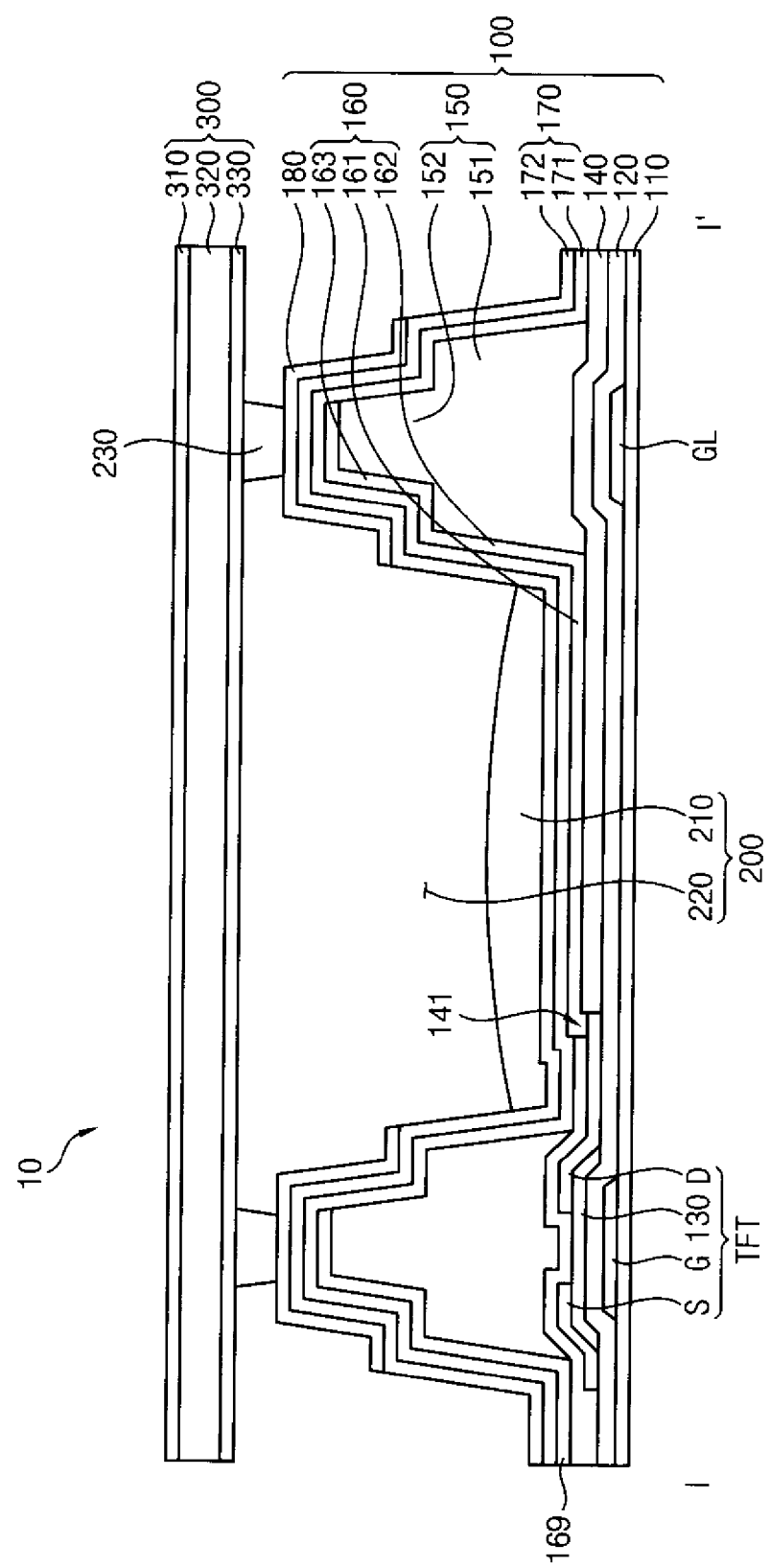
FIG. 2 is a cross-sectional view taken along line I-I' of FIG. 1.

FIG. 1 is a plan view illustrating an exemplary embodiment of an electro-wetting display panel according to the invention. FIG. 2 is a cross-sectional view taken along line I-I' of FIG. 1.

Referring to FIGS. 1 and 2, the exemplary embodiment of an electro-wetting display panel 10 according to the invention includes a display substrate 100, a fluidic layer 200 and an opposite substrate 300.

The display substrate 100 includes a first base substrate 110, a gate line GL, a data line DL, a gate insulating layer 120, a switching element TFT, an organic film 140, a sidewall 150, a pixel electrode 160, a hydrophobic insulating layer 170 and a light blocking layer 180.

The first base substrate 110 may include a transparent insulating material. In one exemplary embodiment, for example, the first base substrate 110 may be a glass substrate, a soda-lime substrate, a plastic substrate and so on.

The gate line GL is on the first base substrate 110. The gate line GL has a longitudinal axis which extends along a first direction D1. The display substrate 100 may include a plurality of the gate lines GL arranged along a second direction D2 crossing the first direction D1, and parallel to each other. Here, the first direction D1 may be perpendicular to the second direction D2, but is not limited thereto or thereby.

The data line DL is on the first base substrate 110, and has a longitudinal axis which extends along the second direction D2. In addition, the display substrate 100 may include a plurality of the data lines DL arranged along the first direction D1, and parallel to each other.

The gate insulating layer 120 is on the first base substrate 110 including the gate line GL, and a gate electrode G extending from the gate line GL.

The switching element TFT includes the gate electrode G, a source electrode S, a semiconductor pattern 130 and a drain electrode D. The gate electrode G is continuous with and extends from the gate line GL. The semiconductor pattern 130 overlaps the gate electrode G and is on the gate insulating layer 120. The source electrode S is continuous with and extends from the data line DL, and is partially on the semiconductor pattern 130. The drain electrode D is spaced apart from the source electrode S, and is partially on the semiconductor pattern 130. Although not shown in the figures, the semiconductor pattern 130 may include a semiconductor layer and an ohmic contact layer.

The organic film 140 is on the first base substrate 110 including the switching element TFT. The organic film 140 may include a photosensitive organic material. A contact hole 141 may be defined in the organic film 140 to expose a portion of the drain electrode D.

The sidewall 150 has longitudinal axes which extend along the first and second directions D1 and D2, such that the sidewall 150 overlaps the gate line GL and the data line DL. In addition, as illustrated in FIG. 1, a portion SW of the sidewall 150 which mainly extends along the first direction D1, has a longitudinal axis which extends along the second direction D2, such that the portion SW overlaps the switching element TFT. In the illustrated exemplary embodiment, the sidewall 150 partially extends along the second direction D2 to overlap the switching element TFT. Alternatively, the sidewall 150 may partially extend along the first direction D1 or another direction to overlap the switching element TFT.

Accordingly, as illustrated in FIG. 2, the sidewall 150 is on the organic film 140, and overlaps the gate line GL, the data line DL and the switching element TFT.

The sidewall 150 extending the first and second directions D1 and D2 divides the display substrate 100 into a unit pixel area P. The sidewall 150 may be considered as defining the unit pixel area P, but the invention is not limited thereto or thereby. The pixel electrode 160 explained below is in the unit pixel area P, and the fluidic layer 200 explained below is disposed in the unit pixel area P.

The sidewall 150 includes a first sidewall portion 151 over the organic film 140, and a second sidewall portion 152 on the first sidewall portion 151. A planar area of an upper surface of the first sidewall portion 151 is larger than that of a lower surface of the second sidewall portion 152, and thus the first and second sidewall portions 151 and 152 form a stepped portion. In one exemplary embodiment, for example, a cross-sectional shape of each of the first and second sidewalls 151 and 152 may be a trapezoid, and a cross-sectional area of the second sidewall portion 152 may be smaller than that of the first sidewall portion 151. The sidewall 150 including the first and second sidewall portions 151 and 152 may be a single, unitary, indivisible member.

The sidewall 150 may include an organic material. Where the sidewall 150 includes the organic material, the pixel electrode 160 and the hydrophobic insulating layer 170 may be more easily formed on the upper surface of the sidewall 150 in a manufacturing process of the electro-wetting display panel 10 and/or of the display substrate 100.

As mentioned above, the sidewall 150 divides the unit pixel area P and defines a predetermined height of the unit pixel area P. Thus, movement of the fluidic layer 200 in the unit pixel area P to an adjacent unit pixel area may be reduced or effectively prevented.

The pixel electrode 160 is on the first base substrate 110 including the organic film 140, and on a side surface and an upper surface of the sidewall 150. The pixel electrode 160 essentially covers the unit pixel area P divided by the sidewall 150.

In one exemplary embodiment, for example, the pixel electrode 160 corresponding to one unit pixel area P extends to a side surface and to an upper surface of one sidewall 150 among sidewalls 150 facing each other along the first direction D1, such as shown at end I of line I-I'. In addition, the pixel electrode 160 extends to a side surface and to an upper surface of one sidewall 150 among sidewalls 150 facing each other along the second direction D2, such as shown at end I' of line I-I'.

In addition, as illustrated in FIG. 1, the pixel electrode 160 corresponding to one unit pixel area P extends to a side surface and to an upper surface of the sidewall 150 overlapping one switching element TFT among switching elements adjacent to each other. In one exemplary embodiment, for example, four switching elements may be adjacent to each other, and thus the pixel electrode 160 may extend to a side surface and an upper surface of the sidewall 150 overlapping one switching element TFT among the four switching elements adjacent to each other.

In the illustrated exemplary embodiment, as illustrated in FIG. 2, the pixel electrode 160 corresponding to one unit pixel area P is electrically connected to the drain electrode D of the switching element TFT connected to a first gate line GL through the contact hole 141, and extends to the side surface and to the upper surface of the sidewall 150 overlapping a second gate line GL adjacent to the first gate line GL. In addition, the pixel electrode 169 corresponding to an adjacent unit pixel area P extends to the side surface and to the upper surface of the sidewall to partially overlap the switching element TFT connected to the first gate line GL.

Here, the sidewall 150 includes the first and second sidewall portions 151 and 152, and thus the pixel electrode 160 may continuously extend to a side surface of the first sidewall portion 151, the stepped portion formed by the first and second sidewall portions 151 and 152, a side surface of the second sidewall portion 152 and an upper surface of the second sidewall portion 152.

In one exemplary embodiment, for example, the pixel electrode 160 includes a first electrode portion 161, a second electrode portion 162 and a third electrode portion 163. The first electrode portion 161 is on the organic film 140. The second electrode portion 162 is connected to the first electrode portion 161 and extends along the side surface of the first sidewall portion 151 and along the stepped portion formed by the first and second sidewall portions 151 and 152. The third electrode portion 163 is connected to the second electrode portion 162 and extends along the side surface and the upper surface of the second sidewall portion 152.

The pixel electrode 169 corresponding to the adjacent unit pixel area P extends to a side surface and an upper surface of the sidewall 150 overlapping the switching element TFT, and is spaced apart from the pixel electrode 160.

In the illustrated exemplary embodiment, the pixel electrode 160 extends to the upper surface of one sidewall among a pair of sidewalls 150 adjacent to each other in a direction. That is, the pixel electrode 160 has a relatively larger planar area owing to the portions thereof extending to the one sidewall 150 among a pair of sidewalls 150. Thus, when a voltage is applied to the pixel electrode 160 and a fluidic layer 200 of the display panel moves, a flow of a fluid of the fluidic layer 200 is guided more correctly. Since the pixel electrode 160 extends to the upper surface of the sidewall 150, movement of a non-conductive fluid of the fluidic layer 200 along and over the sidewall 150 which is overlapped by the pixel electrode 160 may be reduced or effectively prevented. Thus, the exemplary embodiment of the electro-wetting display panel 10 according to the may be driven more correctly.

The pixel electrode 160 may include a transparent conductive material. In one exemplary embodiment, for example, the pixel electrode 160 may include indium tin oxide ("ITO") or indium zinc oxide ("IZO").

The hydrophobic insulating layer 170 includes a barrier layer 171 and a hydrophobic layer 172. The barrier layer 171 is on the sidewall 150 and the pixel electrode 160, and the hydrophobic layer 172 is on the barrier layer 171. The hydrophobic insulating layer 170 is on an entire of the first base substrate 110. In one exemplary embodiment, for example, the hydrophobic insulating layer 170 may be formed on an entire of the first base substrate 110 including the sidewall 150 and the pixel electrode 160 thereon, without any additional process such as patterning.

The barrier layer 171 includes silicon oxide (SiOx) or silicon nitride (SiNx). The hydrophobic layer 172 includes a material having hydrophobicity, and for example, may be Teflon® AF1600 of DuPont™. When a voltage is applied to the pixel electrode 160, an interface of the hydrophobic layer 172 is changed to have hydrophilicity. Thus, a conductive fluid of the fluidic layer 200 moves to the hydrophobic layer 172 having hydrophilicity, and thus a non-conductive fluid of the fluidic layer 200 moves opposite to the movement of the conductive fluid.

The barrier layer 171 is on an upper surface of the pixel electrode 160, and thus reduces or effectively prevents a decrease in the hydrophobicity of the hydrophobic layer 172 due to a spread between the hydrophobic layer 172 and the pixel electrode 160.

The light blocking layer 180 is on the hydrophobic layer 170, to overlap the sidewall 150. In one exemplary embodiment, for example, the light blocking layer 180 overlaps the stepped portion formed by the first and second sidewall portions 151 and 152, the side surface of the second sidewall portion 152 and the upper surface of the second sidewall portion 152.

The light blocking layer 180 includes a metal or metal oxide. In one exemplary embodiment, for example, the light blocking layer 180 may include chromium (Cr) or chromium oxide.

The light blocking layer 180 overlaps the gate line GL, the data line DL and the switching element TFT, to block a light. In addition, in the illustrated exemplary embodiment, the light blocking layer 180 has hydrophilicity and is on the sidewall 150. Thus, even though the non-conductive fluid of the fluidic layer 200 moves along the sidewall 150, the hydrophilicity of the light blocking layer 180 blocks further movement thereof along the sidewall 150. Thus, movement of the non-conductive fluid of the fluidic layer 200 to an adjacent unit pixel area P is reduced or effectively prevented.

Accordingly, the light blocking layer 180 restricts or effectively blocks the movement of the non-conductive fluid of the fluidic layer 200, and thus movement of the non-conductive fluid to the adjacent unit pixel area P is reduced or effectively prevented both in manufacturing the electro-wetting display panel 10 and in driving the electro-wetting display panel 10, according to the illustrated exemplary embodiment.

The opposite substrate 300 faces the display substrate 100, and includes a second base substrate 310, a color filter 320 and a common electrode 330.

The second base substrate 310 may include a transparent insulating material similar to the material of first base substrate 110.

The color filter 320 may be on the second base substrate 310. The opposite substrate 300 may include a color filter layer 320 including a plurality of color filters, such as a red (R), green (G) and/or blue (B) color filter.

The common electrode 330 is on the second base substrate 310 including the color filter 320, and includes a transparent conductive material. The common electrode 330 is on an entire of the second base substrate 310. In one exemplary embodiment, for example, the common electrode 330 may be formed to cover an entire of the unit pixel area P of the second base substrate 310 without additional an additional process such as patterning. In one exemplary embodiment, for example, the common electrode 330 may include IZO, ITO and so on.

The fluidic layer 200 is disposed between the display substrate 100 and the opposite substrate 300, and includes first and second fluids 210 and 220. The first and second fluids 210 and 220 have specific gravities different from each other, and form an interfacial surface without mixing with each other. The first fluid 210 functions as a light shutter to block or transmit light, and may be an oil having a black dye or a material absorbing the light. Thus, the first fluid 210 may be a non-conductive material. However, the second fluid 220 has conductivity or polarity, and may be, for example, a water or ethylene glycol.

A column spacer 230 may be disposed between the light blocking layer 180 and the common electrode 330, to maintain a cell gap between the display substrate 100 and the opposite substrate 300.

Figure 3:
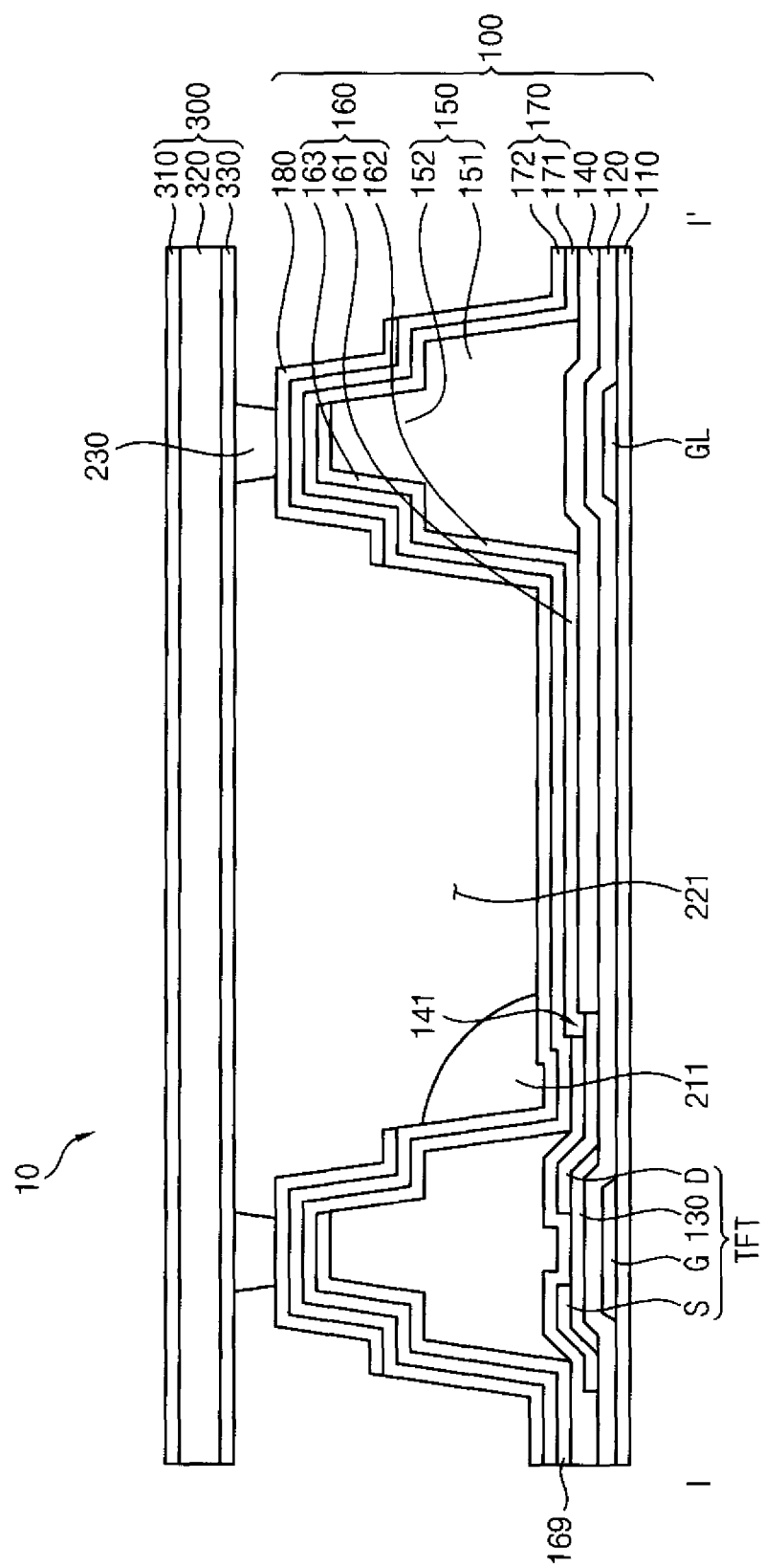
FIG. 3 is the cross-sectional view of FIG. 2 illustrating the electro-wetting display panel of FIG. 1 when a voltage is applied thereto.

FIG. 3 is the cross-sectional view of FIG. 2 illustrating the electro-wetting display panel of FIG. 1 when a voltage is applied thereto.

Referring to FIGS. 2 and 3, FIG. 2 illustrates a distribution of the fluidic layer 200 with no applied voltage to the exemplary embodiment of the electro-wetting display panel 10 according to the invention, and FIG. 3 illustrates a distribution of the fluidic layer 200 with an applied voltage to the exemplary embodiment of the electro-wetting display panel 10 according to the invention.

As illustrated in FIG. 2, when the voltage is not applied to the electro-wetting display panel 10, the first fluid 210 is uniformly distributed on the hydrophobic insulating layer 170. Thus, an external light from outside (e.g., a natural light) or an internal light from a light source module incident into the electro-wetting display panel 10 is blocked by the first fluid 210, and the electro-wetting display panel 10 displays a dark color.

However, as illustrated in FIG. 3, when the voltage is applied to the pixel electrode 160 and the common electrode 330 of the electro-wetting display panel 10, an electric field is generated in the electro-wetting display panel 10, and the first fluid 211 starts to move.

Here, as mentioned above, the first fluid 210 in FIG. 2 moves toward a portion of the unit pixel area P excluding the pixel electrode 160. In the illustrated exemplary embodiment of FIG. 3, the pixel electrode 160 extends to the upper surface of the right side sidewall 150 which overlaps the gate line GL, such that the second fluid 220 of FIG. 2 becomes a second fluid 221 in FIG. 3 which has moved toward the pixel electrode 160 on the right side sidewall 150. Thus, the first fluid 210 of FIG. 2 is displaced by the moved second fluid 221 and becomes a first fluid 211 in FIG. 3 which has moved toward the sidewall 150 overlapping the switching element TFT which is not overlapped by the pixel electrode 160.

Since the light blocking layer 180 has hydrophilicity, the non-conductive first fluid 211 may be repelled by the light blocking layer 180. Since hydrophobicity of an interface of the hydrophobic layer 172 excluding the pixel electrode 160 thereon is maintained, the first fluid 211 moves to the hydrophobic interface of the hydrophobic layer 172 excluding the pixel electrode 160 thereon. Here, since the first fluid 211 does not move to the light blocking layer 180 having hydrophilicity, the first fluid 211 moves to the left side sidewall 150 excluding the light blocking layer 180 as illustrated in FIG. 3.

Thus, the external light from outside or the internal light from the light source module incident into the electro-wetting display panel 10 is not blocked by the first fluid 211 and passes through the second fluid 221, and the electro-wetting display panel 10 displays a bright or white color.

FIGS. 4A to 4G are cross-sectional views illustrating an exemplary embodiment of a method for manufacturing the electro-wetting display panel along line I-I' of FIG. 1.

Figure 4A:
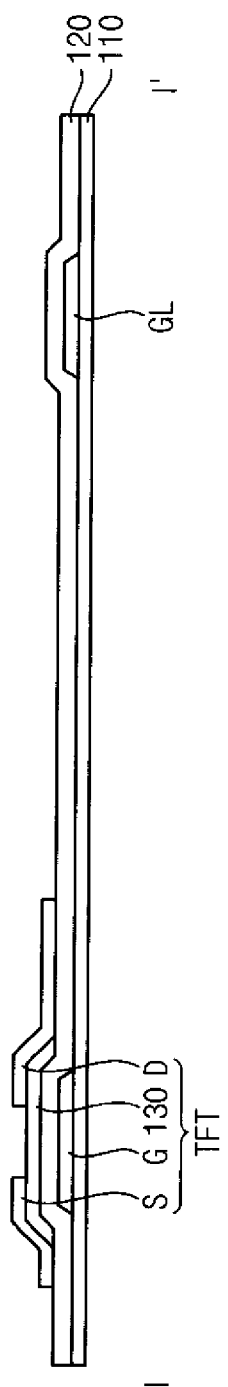
FIGS. 4A to 4G are cross-sectional views illustrating an exemplary embodiment of a method for manufacturing the electro-wetting display panel of FIG. 1.

Referring to FIG. 4A, a gate metal layer (not shown) is formed (e.g., provided) on the first base substrate 110, and the gate metal layer is patterned to form a gate metal pattern including the gate line GL and the gate electrode G.

Then, after forming the gate insulating layer 120, a semiconductor pattern 130 including a semiconductor layer and an ohmic contact layer is formed on the first base substrate 110.

Then, a source metal layer (not shown) is formed on the first base substrate 110 including the semiconductor pattern 130, and the source metal layer is patterned to form a source metal pattern including the data line DL, the source electrode S and the drain electrode D.

Figure 4B:
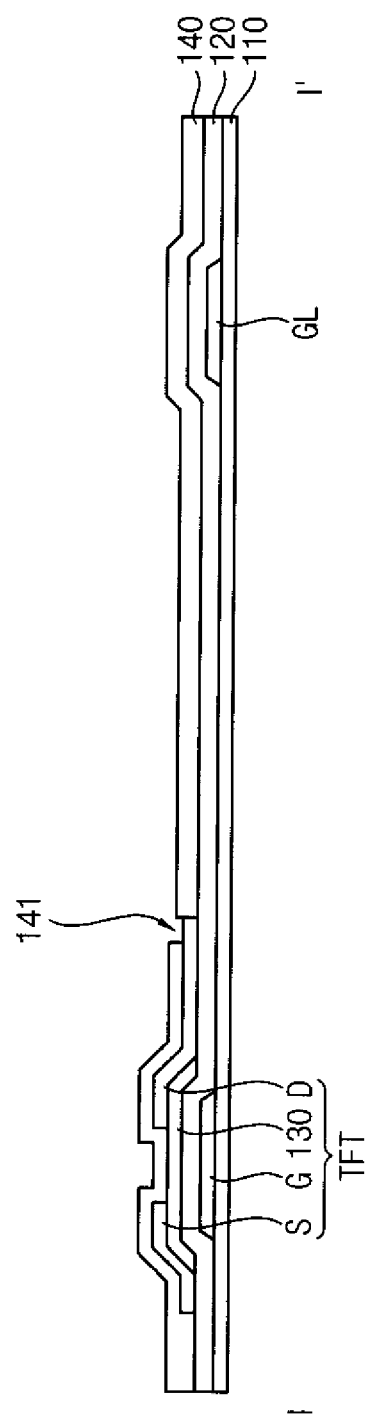

Referring to FIG. 4B, the organic film 140 is formed on the first base substrate 110 including the source metal pattern, and the organic film 140 is exposed and developed to define therein a contact hole 141 partially exposing the drain electrode D.

Figure 4C:
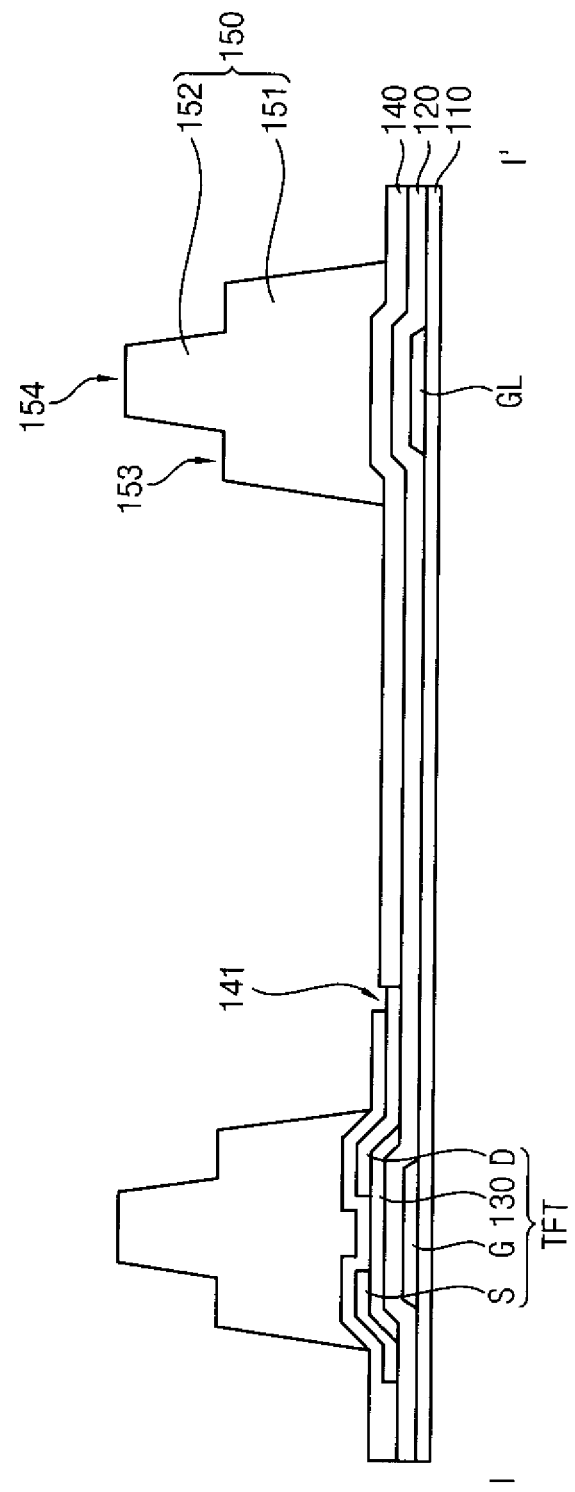

Referring to FIG. 4C, an organic layer (not shown) is formed on the first substrate 110 including the organic film 140, and the organic layer is patterned to form the sidewall 150 overlapping the gate line GL, the data line DL and the switching element TFT.

Here, the organic layer may be patterned using a slit mask or a half-tone mask, and thus first and second sidewall portions 151 and 152 of the sidewall 150 form a stepped portion. As indicated in FIG. 4C, for example, the first and second sidewall portions 151 and 152 form a stepped surface 153. The stepped surface 153 may be considered an upper surface of the first sidewall portion 151, while the second sidewall portion 152 includes upper surface 154.

Figure 4D:
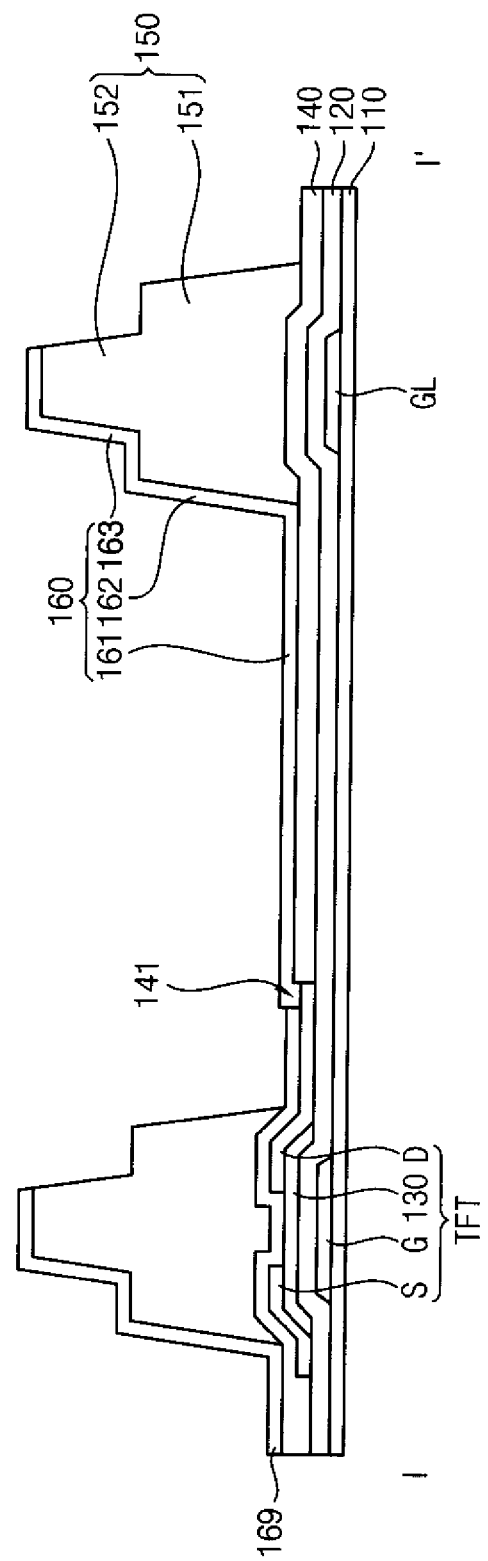

Referring to FIG. 4D, an electrode layer (not shown) is formed on the first base substrate 110 including the sidewall 150, and is electrically connected to the switching element TFT through the contact hole 141 defined in the organic film 140. Then, the electrode layer is patterned to form the first electrode portion 161 on the organic film 140, to form the second electrode portion 162 on the side surface of the first sidewall portion 151 and on the stepped portion 153, and to form the third electrode portion 163 on the side surface and the upper surface 154 of the second sidewall portion 152. Thus, the pixel electrode 160 is completed. Here, since the pixel electrode 160 is explained referring to FIGS. 1 and 2 above, any further explanation regarding the pixel electrode 160 is omitted.

Figure 4E:
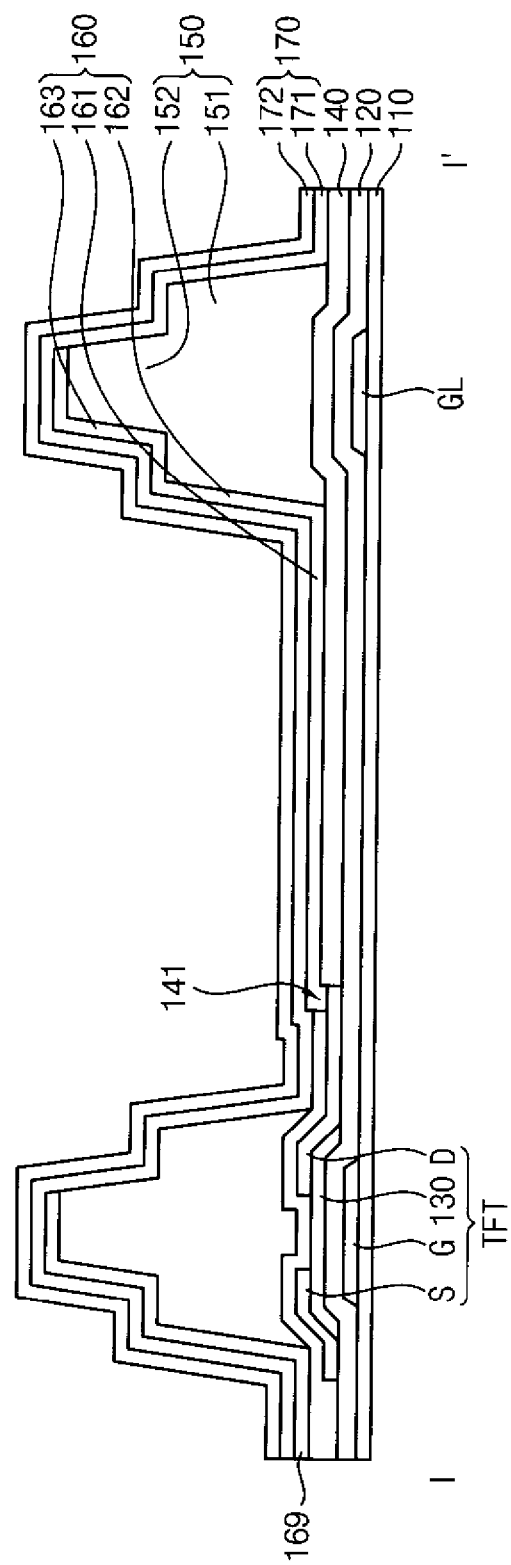

Referring to FIG. 4E, the barrier layer 171 is formed on the first base substrate 110 including the sidewall 150 and the pixel electrode 160, and the hydrophobic layer 172 is formed on the barrier layer 171. Thus, the hydrophobic insulating layer 170 is completed. Here, the barrier layer 171 and the hydrophobic layer 172 may be formed on an entire of the first base substrate 110.

Figure 4F:
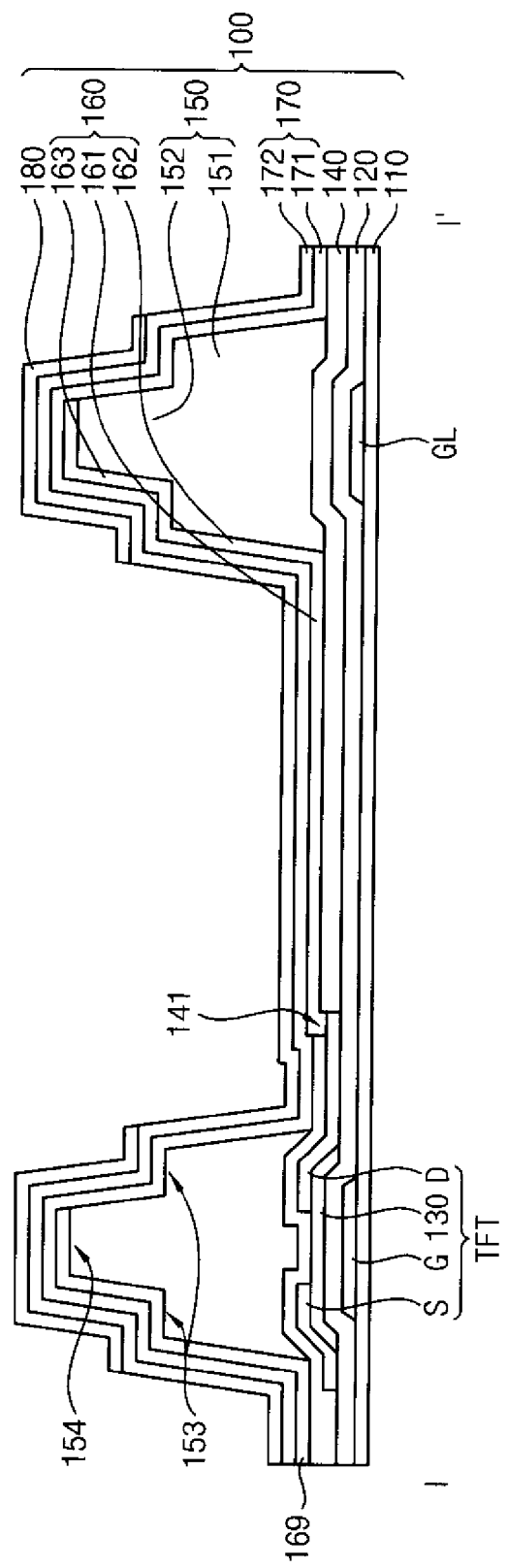

Referring to FIG. 4F, a metal layer (not shown) is formed on the first base substrate 110 including the hydrophobic insulating layer 170. Then, the metal layer is patterned to form the light blocking layer 180 to overlap the stepped portion 153 of the sidewall 150, the side surface of the second sidewall portion 152 and the upper surface 154 of the second sidewall portion 152.

Figure 4G:
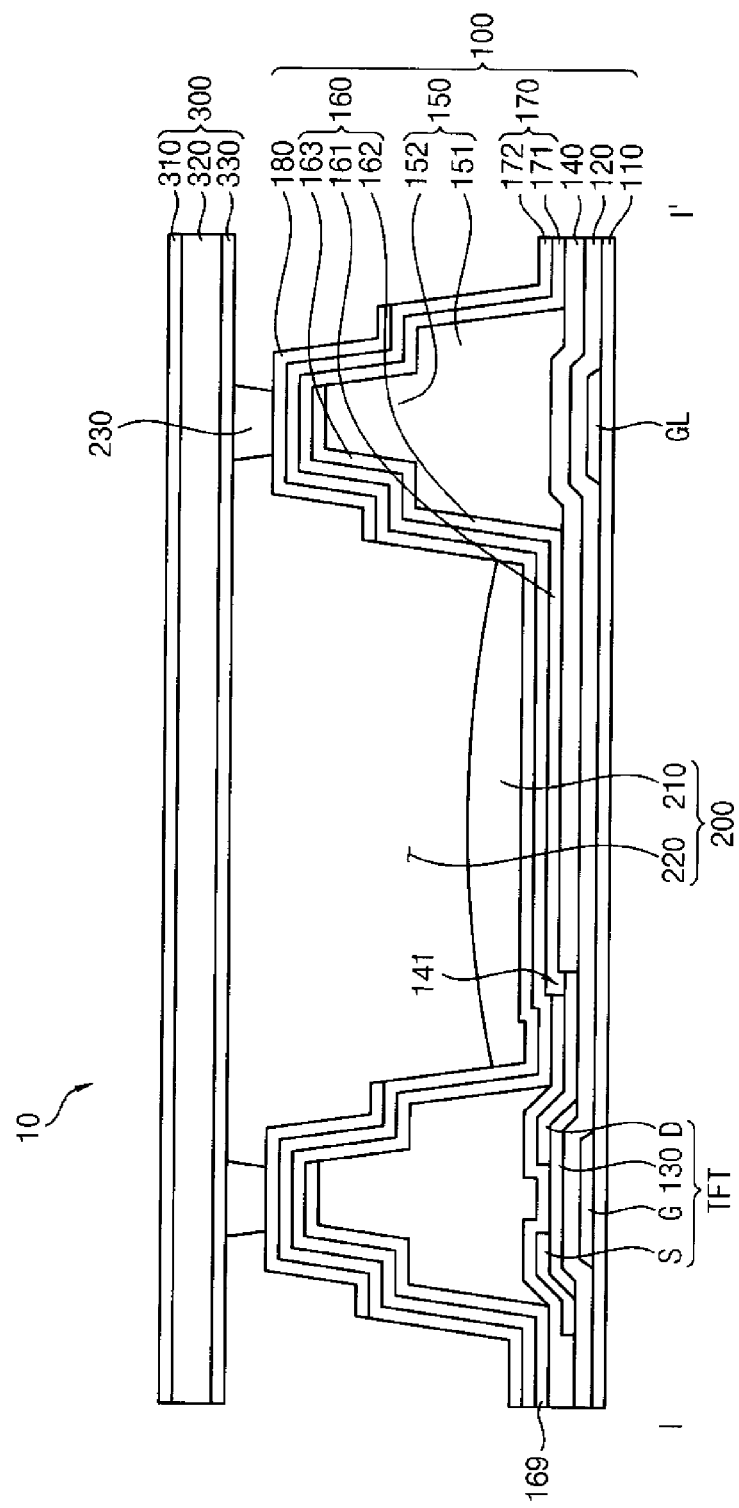

Referring to FIG. 4G, the second base substrate 310, the color filter 320 and the common electrode 330 are sequentially formed to complete the opposite substrate 300. Then, the fluidic layer 200 including the first and second fluids 210 and 220 is disposed and sealed between the opposite and display substrates 300 and 100, and the opposite substrate 300 is combined with the display substrate 100. Here, the column spacer 230 may be disposed between the light blocking layer 180 and the common electrode 330 to maintain a cell gap between the opposite and display substrates 300 and 100. Thus, the exemplary embodiment of the electro-wetting display panel 10 according to the invention is completed.

FIG. 5 is a cross-sectional view illustrating an exemplary embodiment of an electro-wetting display apparatus having the electro-wetting display panel of FIG. 1.

Referring to FIG. 5, the electro-wetting display apparatus 1 includes the electro-wetting display panel 10 and a backlight assembly 20. The electro-wetting display panel 10 is explained referring to FIGS. 1 and 2, and thus any repetitive explanation will be omitted.

The backlight assembly 20 is disposed under the electro-wetting display panel 10, and generates and provides light to the electro-wetting display panel 10. The backlight assembly 20 includes a light source 21, a light guide plate 22, an optical element 23 and a reflective plate 24.

The light source 21 generates and emits the light, and the light guide plate 22 provides the light incident from the light source 21 to the electro-wetting display panel 10.

The exemplary embodiment of the electro-wetting display apparatus 1 according to the invention includes the backlight assembly 20 and thus the light is provided within the electro-wetting display apparatus 1, but a structure of the backlight assembly 20 is not limited thereto. In alternative exemplary embodiments, for example, the backlight assembly 20 may have various shapes or structures, or the backlight assembly 20 may be omitted and an external light (e.g., natural light) may be provided to the electro-wetting display apparatus 1.

Figure 6:
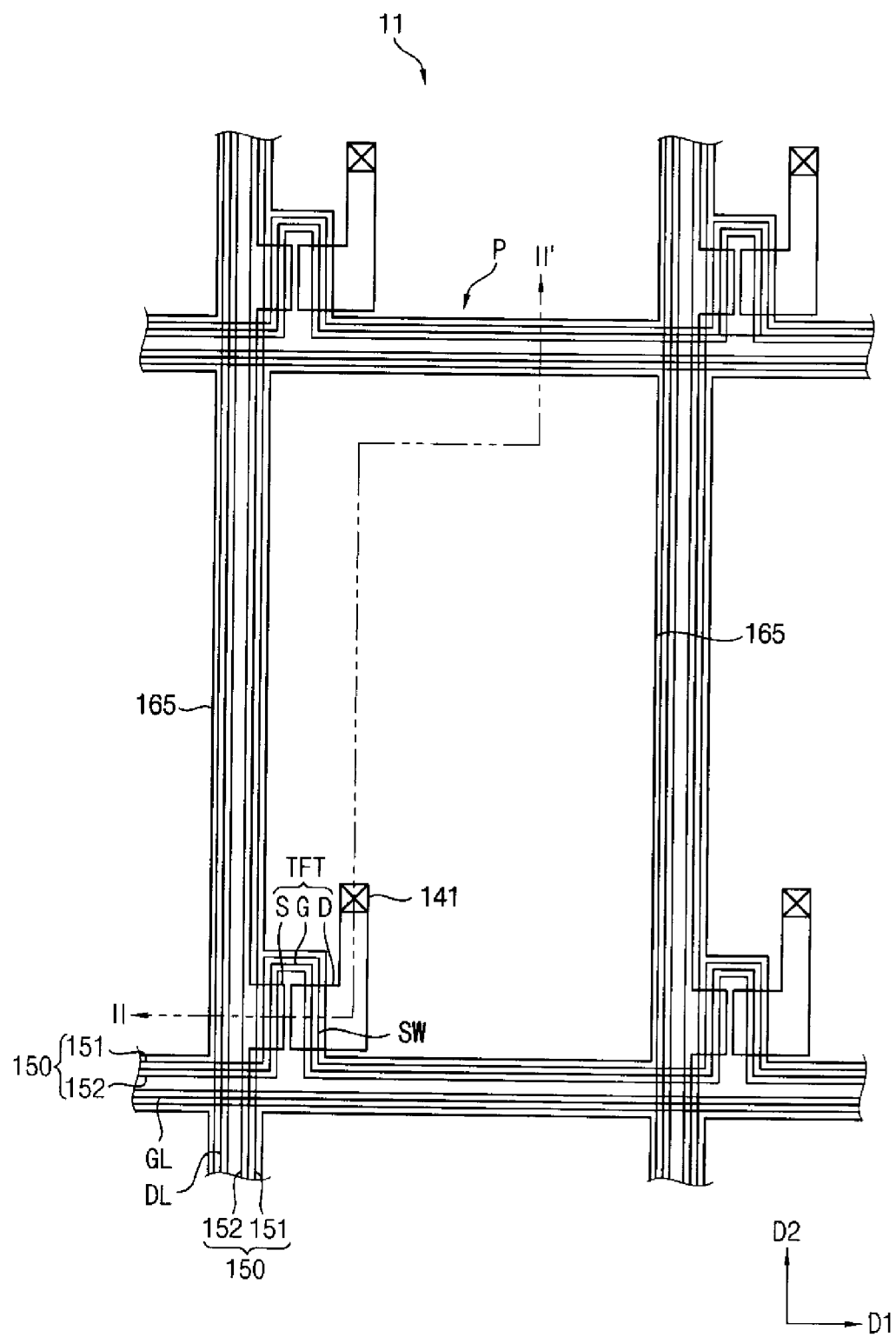
FIG. 6 is a plan view illustrating another exemplary embodiment of an electro-wetting display panel according to the invention.
Figure 7:
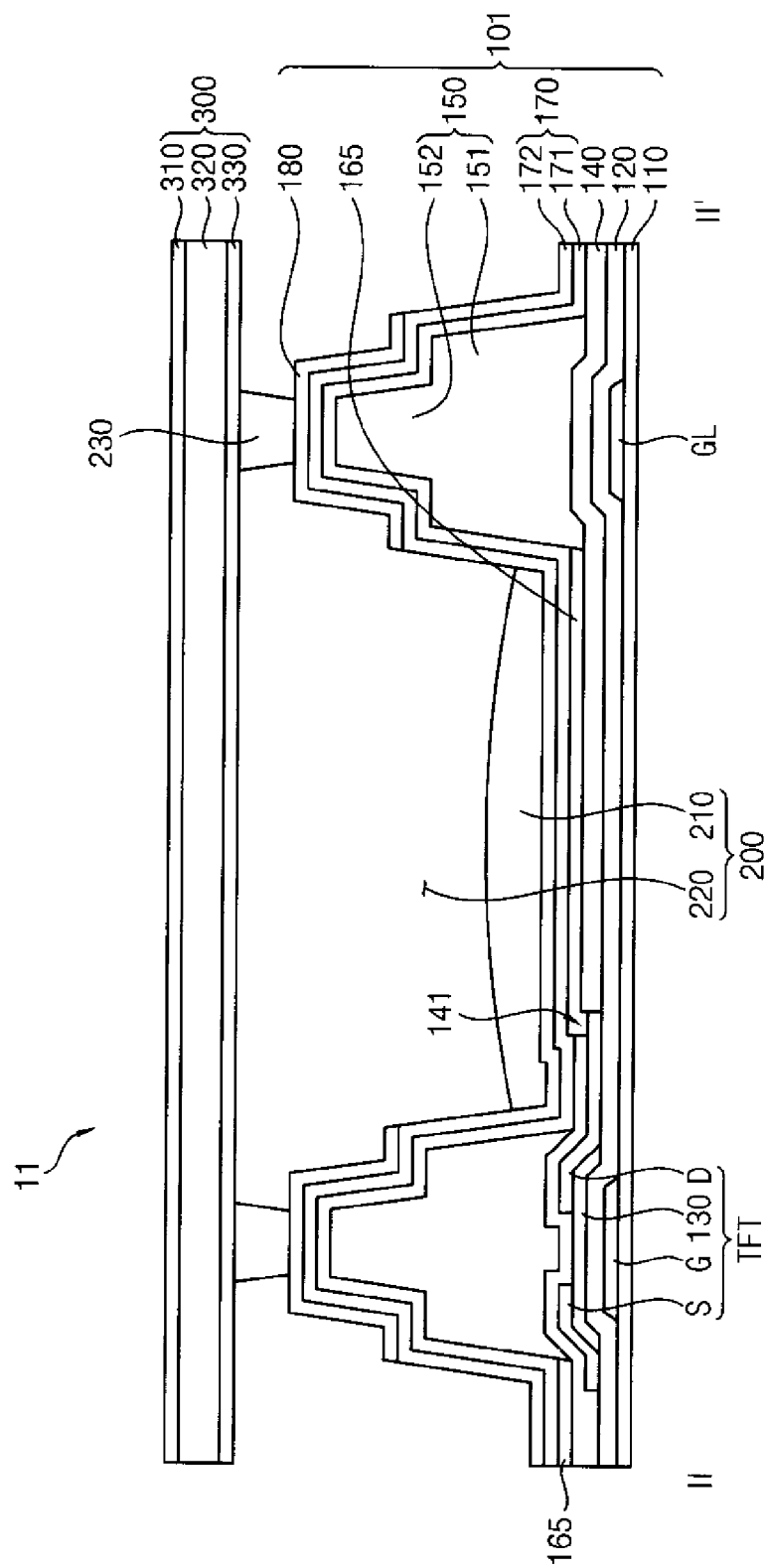
FIG. 7 is a cross-sectional view taken along line II-II' of FIG. 6.

FIG. 6 is a plan view illustrating another exemplary embodiment of an electro-wetting display panel according to the invention. FIG. 7 is a cross-sectional view taken along line II-II' of FIG. 6.

The exemplary embodiment of the electro-wetting display panel 11 in FIGS. 6 and 7 is substantially the same as the previous exemplary embodiment of the electro-wetting display panel 10 in FIGS. 1 and 2, except for a position of a pixel electrode 165. Thus, same reference numerals are used and any repetitive explanation will be omitted.

Referring to FIGS. 6 and 7, in the electro-wetting display panel 11, the pixel electrode 165 of a display substrate 101 is only on the organic film 140, and does not extend along the side surface or the upper surface of the sidewall 150.

As illustrated in FIGS. 6 and 7, for example, the pixel electrode 165 is electrically connected to the drain electrode D of the switching element TFT through the contact hole 141 defined in the organic film 140, and is only on the organic film 140 in the unit pixel area P divided by the sidewall 150. Thus, the pixel electrode 165 is only extended along the organic film 140 without extending along the side surface of the first sidewall portion 151, the stepped portion between the first and second sidewall portions 151 and 152, the side surface of the second sidewall portion 152, and the upper surface of the second sidewall portion 152.

In the illustrated exemplary embodiment, the pixel electrode 165 does not extend along the side surface or the upper surface of the sidewall 150, and thus the pixel electrode 165 may be formed relatively simply in a manufacturing process of the electro-wetting display panel 11. In addition, even though the pixel electrode 165 does not extend along the side surface or the upper surface of the sidewall 150, the light blocking layer 180 having hydrophilicity is extended along the side surface and the upper surface of the sidewall 150. Thus, movement of the non-conductive fluid of the fluidic layer 200 to the sidewall 150 is reduced or effectively prevented, and thus the movement of the fluidic layer 200 is guided more correctly.

An exemplary embodiment of a method for manufacturing the electro-wetting display panel 11 according to the invention is substantially the same as the previous exemplary embodiment of the method for manufacturing the electro-wetting display panel 10 in FIGS. 4A to 4G, except for forming the pixel electrode 165, and thus any repetitive explanation will be omitted.

In an exemplary embodiment of a process for forming the pixel electrode 165, an electrode layer (not shown) is formed on the first base substrate 110 including the organic film 140 and the sidewall 150, to be electrically connected to the switching element TFT through the contact hole 141 defined in the organic film 140.

Then, the electrode layer is patterned to form the pixel electrode 165 on the organic film 140 except for the side surface and the upper surface of the sidewall 150. That is, a portion of the electrode layer extended along the side surface and the upper surface of the sidewall 150 may be removed in forming the pixel electrode 165.

Figure 8:
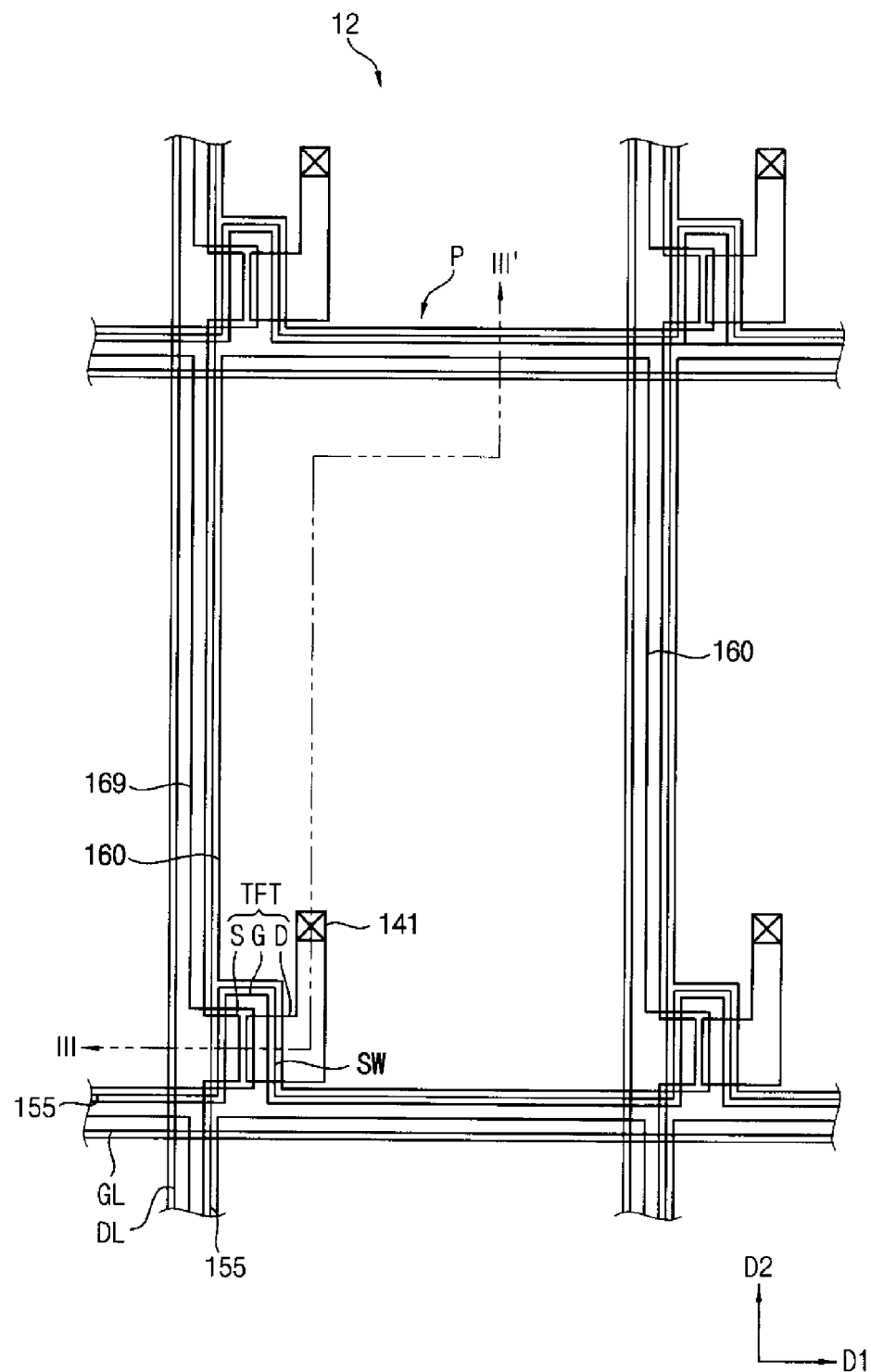
FIG. 8 is a plan view illustrating still another exemplary embodiment of an electro-wetting display panel according to the invention.
Figure 9:
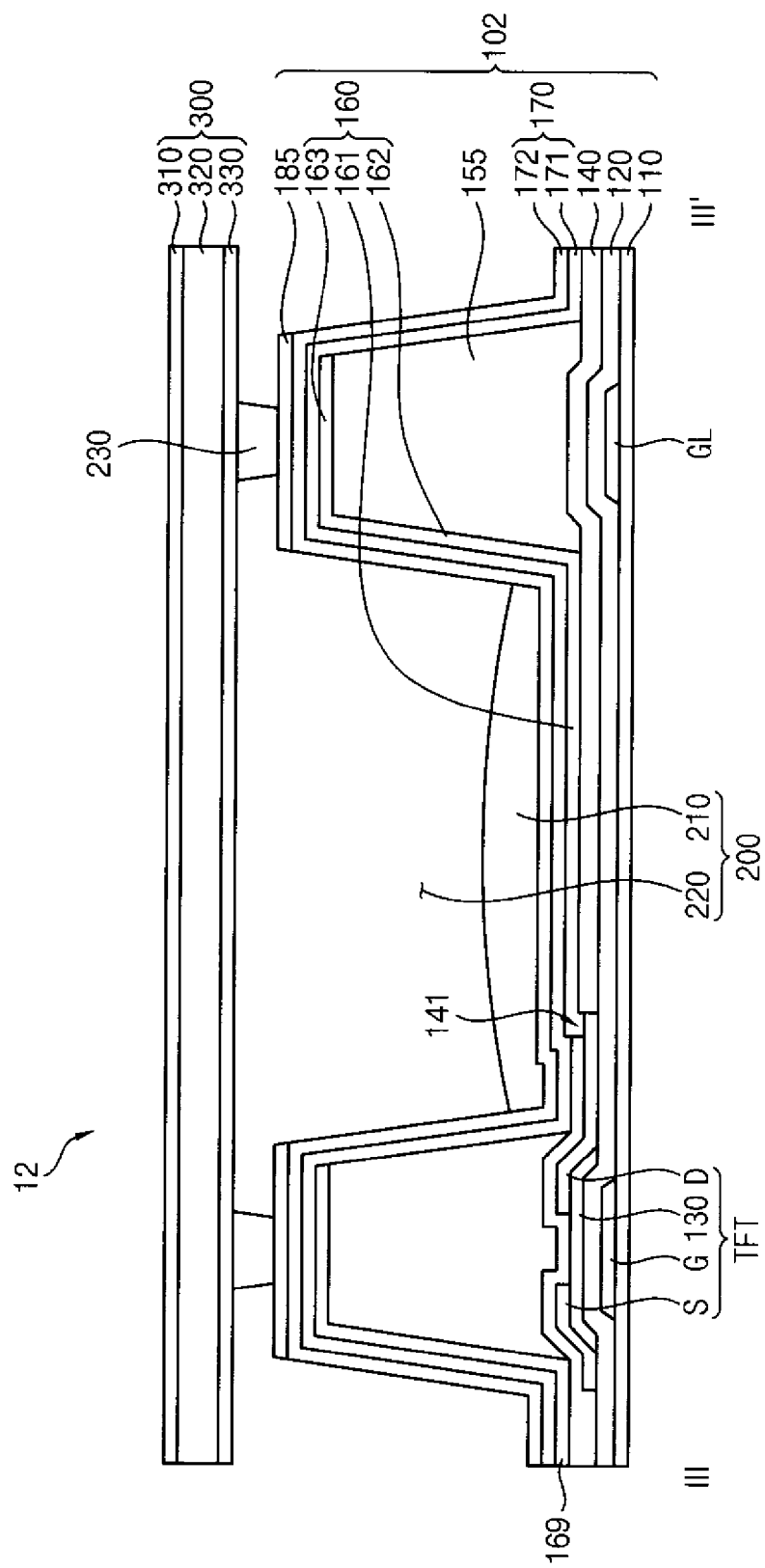
FIG. 9 is a cross-sectional view taken along line III-III' of FIG. 8.

FIG. 8 is a plan view illustrating still another exemplary embodiment of an electro-wetting display panel according to the invention. FIG. 9 is a cross-sectional view taken along line III-III' of FIG. 8.

The exemplary embodiment of the electro-wetting display panel 12 in FIGS. 8 and 9 is substantially the same as the previous exemplary embodiment of the electro-wetting display panel 10 in FIGS. 1 and 2, except for a shape and a structure of a sidewall 155 and a light blocking layer 185. Thus, same reference numerals are used and any repetitive explanation will be omitted.

Referring to FIGS. 8 and 9, in the electro-wetting display panel 12, the sidewall 155 of a display substrate 102 does not have a stepped portion, and instead has a cross-sectional shape of a trapezoid.

Accordingly, the sidewall 155 does not include the stepped portion, and thus the pixel electrode 160 includes a first electrode portion 161 on an upper surface of the organic film 140, a second electrode portion 162 on a side surface of the sidewall 155, and a third electrode portion 163 on an upper surface of the sidewall 155. In addition, the hydrophobic insulating layer 170 on the first base substrate 110 including the pixel electrode 160 and the sidewall 155, is on the side and upper surfaces of the sidewall 155.

In the illustrated exemplary embodiment, the light blocking layer 185 is on the hydrophobic insulating layer 170 to overlap the upper surface of the sidewall 155 and to not extend along the side surface of the sidewall 155. Thus, in an exemplary embodiment of a manufacturing process of the electro-wetting display panel 12 and/or the display substrate 102, the light blocking layer 185 is easily aligned with the upper surface of the sidewall 155 in forming the light blocking layer 185, as compared to having to also align the light blocking layer 185 with the side surface of the sidewall 155. In addition, when the light blocking layer 185 overlaps and is extended along the side surface of the sidewall 155, the movement of the first fluid 210 of the fluidic layer 200 may be blocked by the light blocking layer 185.

Accordingly, even though the light blocking layer 185 overlaps only the upper surface of the sidewall 155, movement of the first fluid 210 along the sidewall 155 is still effectively reduced or prevented due to the hydrophilicity of the light blocking layer 185. Thus, movement of the first fluid 210 to an adjacent unit pixel area P is reduced or effectively prevented.

In addition, since the sidewall 155 does not have the stepped portion, any additional mask like the slit mask or the half-tone mask is unnecessary to form the sidewall 155 so that the manufacturing process may be further simplified.

An exemplary embodiment of a method for manufacturing the electro-wetting display panel 12 according to the invention is substantially the same as the previous exemplary embodiment of the method for manufacturing the electro-wetting display panel 10 in FIGS. 4A to 4G, except for forming the sidewall 155, the pixel electrode 160 and the light blocking layer 185, and thus any repetitive explanation will be omitted.

In an exemplary embodiment, for example, the sidewall 155, the pixel electrode 160 and the light blocking layer 185 are formed as follows.

The organic layer (not shown) is formed on the first base substrate 110 including the organic film 140, and the organic layer is patterned to form the sidewall 155 to overlap the gate line GL, the data line DL and the switching element TFT.

Here, the organic layer is patterned without using an additional mask like the slit mask or the half-tone mask, and thus the sidewall 155 has the side and upper surface without forming a stepped portion.

Then, an electrode layer (not shown) is formed on the first base substrate 110 including the organic layer 140 and the sidewall 155, to be electrically connected to the switching element TFT through the contact hole 141 defined in the organic film 140. Then, the electrode layer is patterned to form the first electrode portion 161 on the upper surface of the organic film 140, the second electrode portion 162 on the side surface of the sidewall 155, and the third electrode portion 163 on the upper surface of the sidewall 155. Thus, the pixel electrode 160 is completed.

Then, a metal layer (not shown) is formed on the first base substrate 110 including the hydrophobic insulating layer 170, and the metal layer is patterned to form the light blocking layer 185 to overlap the upper surface of the sidewall 155 and to not overlap the side surface of the sidewall 155.

Figure 10:
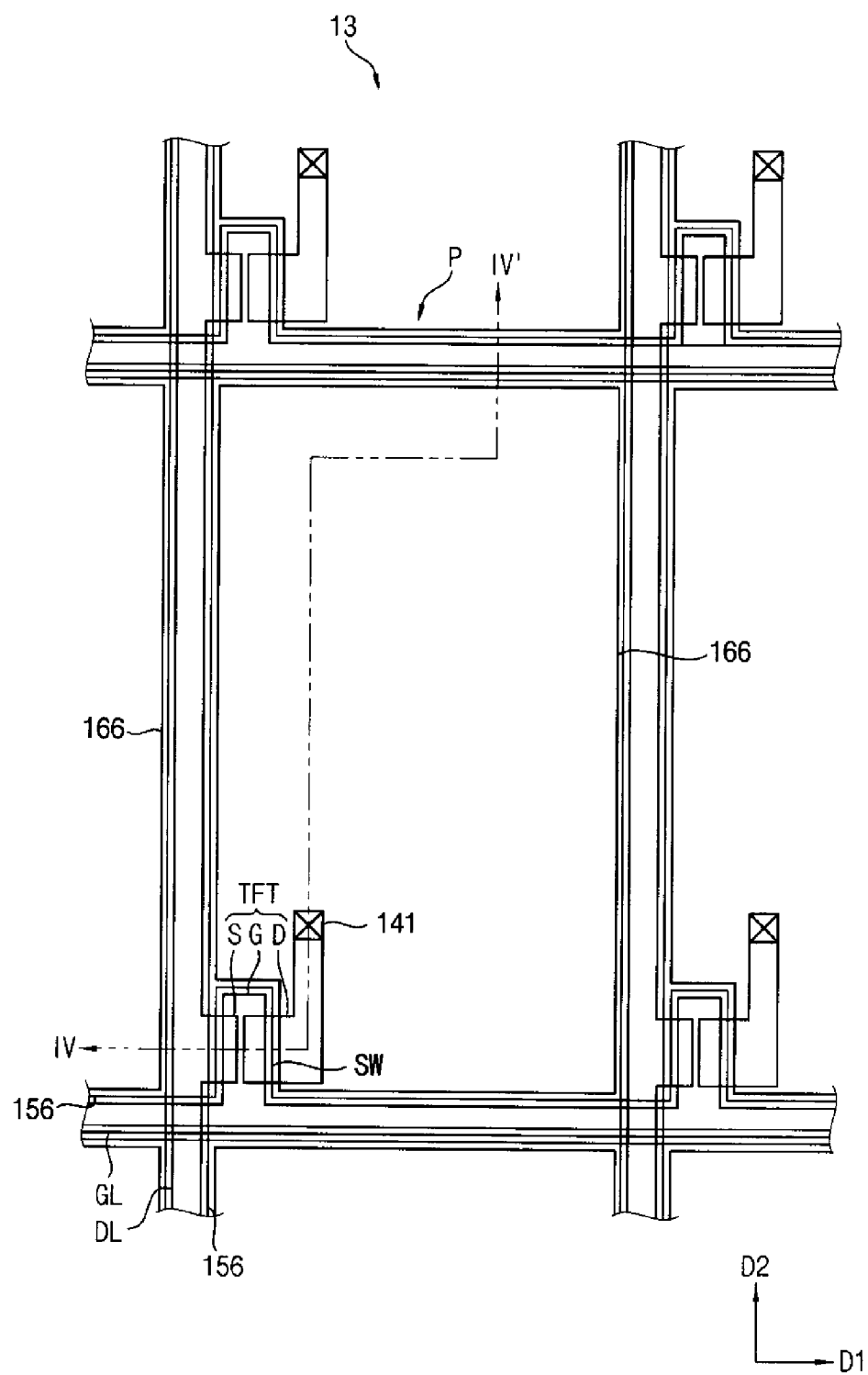
FIG. 10 is a plan view illustrating yet another exemplary embodiment of an electro-wetting display panel according to the invention.
Figure 11:
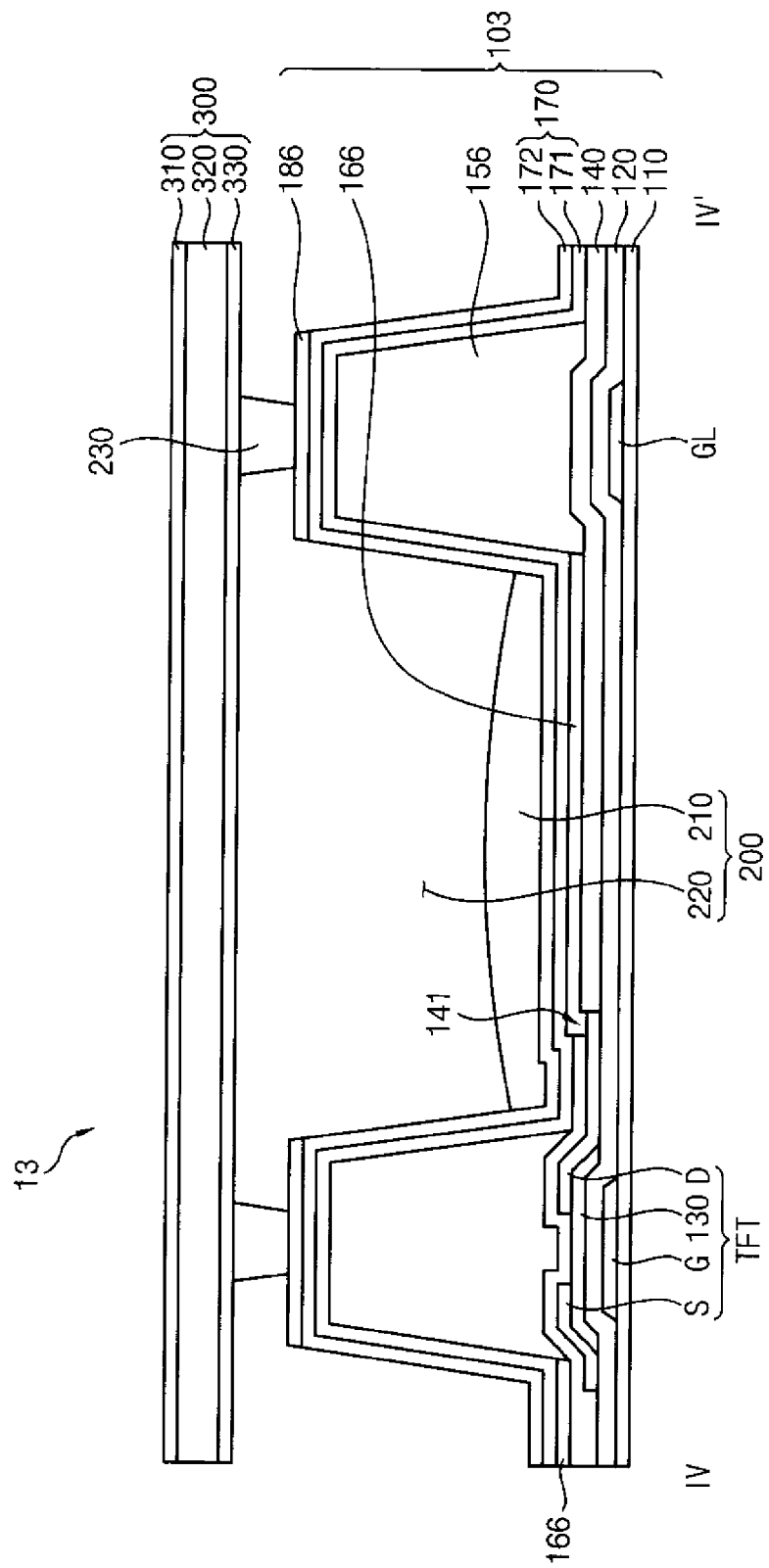
FIG. 11 is a cross-sectional view taken along line IV-IV' of FIG. 10.

FIG. 10 is a plan view illustrating yet another exemplary embodiment of an electro-wetting display panel according to the invention. FIG. 11 is a cross-sectional view taken along line IV-IV' of FIG. 10.

The exemplary embodiment of the electro-wetting display panel 13 in FIGS. 10 and 11 is substantially the same as the previous exemplary embodiment of the electro-wetting display panel 10 in FIGS. 1 and 2, except for a position of a pixel electrode 166, and a shape and a structure of a sidewall 156 and a light blocking layer 186. Thus, same reference numerals are used and any repetitive explanation will be omitted.

Referring to FIGS. 10 and 11, in the electro-wetting display panel 13, the pixel electrode 166 of a display substrate 103 is only on the organic film 140 and does not extend along the side surface or the upper surface of the sidewall 156.

As illustrated in FIGS. 10 and 11, for example, the pixel electrode 166 is electrically connected to the drain electrode D of the switching element TFT through the contact hole 141 defined in the organic film 140, and is only on the upper surface of the organic film 140 in the unit pixel area P divided by the sidewall 156. Thus, the pixel electrode 166 is only extended along the upper surface of the organic film 140 without extending along the side surface and the upper surface of the sidewall 156.

In addition, in the electro-wetting display panel 13, the sidewall 156 of the display substrate 103 does not have a stepped portion, and instead has a cross-sectional shape of a trapezoid. Thus, the hydrophobic insulating layer 170 is extended along the side and upper surfaces of the sidewall 156.

Further, in the electro-wetting display panel 13, the light blocking layer 186 is on the upper surface of the hydrophobic insulating layer 170 to overlap the sidewall 156 and to not extend along the side surface of the sidewall 156. Here, the sidewall 156 does not have a stepped portion, and thus the light blocking layer 186 overlaps only the upper surface of the sidewall 156. Thus, in an exemplary embodiment of a manufacturing process of the electro-wetting display panel 13 and/or the display substrate 103, the light blocking layer 186 is easily aligned with the upper surface of the sidewall 156 in forming the light blocking layer 186, as compared to having to also align the light blocking layer 186 with the side surface of the sidewall 156. In addition, when the light blocking layer 186 overlaps and is extended along the side surface of the sidewall 156, the movement of the first fluid 210 of the fluidic layer 200 may be blocked by the light blocking layer 186.

Accordingly, in the electro-wetting display panel 13, the pixel electrode 166 does not extend along the side surface or the upper surface of the sidewall 156, and thus the pixel electrode 166 may be formed more easily in a manufacturing process of the electro-wetting display panel 13. In addition, even though the pixel electrode 165 does not extend along the side surface or the upper surface of the sidewall 156, the light blocking layer 186 having the hydrophilicity is extended along the upper surface of the sidewall 156, and thus overflowing of the sidewall 156 of the non-conductive first fluid 210 of the fluidic layer 200 is reduced or effectively prevented. Thus, the movement of the fluidic layer 200 may be guided more correctly.

Even though the light blocking layer 186 overlaps only the upper surface of the sidewall 156, the movement of the first fluid 210 along and over the sidewall 156 is blocked by the light blocking layer 186. Thus, the first fluid 210 does not move to the adjacent unit pixel area P.

In addition, since the sidewall 156 has no stepped portion, an additional mask like the slit mask or the half-tone mask is unnecessary in forming the sidewall 156 so that the manufacturing process may be further simplified.

An exemplary embodiment of a method for manufacturing the electro-wetting display panel 13 according to the invention is substantially the same as the previous exemplary embodiment of the method for manufacturing the electro-wetting display panel 10 in FIGS. 4A to 4G, except for forming the sidewall 156, the pixel electrode 166 and the light blocking layer 186, and thus any repetitive explanation will be omitted.

In an exemplary embodiment, for example, the sidewall 156, the pixel electrode 166 and the light blocking layer 186 are formed as follows.

An organic layer (not shown) is formed on the first base substrate 110 including the organic film 140, and the organic layer is patterned to form the sidewall 156 to overlap the gate line GL, the data line DL and the switching element TFT.

Here, the organic layer is patterned without using an additional mask like the slit mask or the half-tone mask, and thus the sidewall 155 has the side and upper surfaces without forming a stepped portion.

Then, an electrode layer (not shown) is formed on the first base substrate 110 including the organic layer 140 and the sidewall 156, to be electrically connected to the switching element TFT through the contact hole 141 defined in the organic film 140. Then, the electrode layer is patterned to form the pixel electrode 166 on the upper surface of the organic layer 140.

Then, a metal layer (not shown) is formed on the first base substrate 110 including the hydrophobic insulating layer 170. Then, the metal layer is patterned to form the light blocking layer 186 to overlap the upper surface of the sidewall 156 and to not overlap the side surface of the sidewall 156.

According to one or more exemplary embodiments of the invention, a hydrophobic insulating layer within an electro-wetting display panel is on and extends along a sidewall, and thus a plasma applying process and a recovery process may be omitted, compared to a conventional electro-wetting display panel where the sidewall is on the hydrophobic insulating layer. Thus, one or more exemplary embodiment of the processes of forming the electro-wetting display panel of according to the invention may be more efficient.

In addition, since the recovery process may be omitted in one or more exemplary embodiment of the invention, a decrease in the hydrophobicity of the hydrophobic insulating layer due to the recovery process may be reduced or effectively prevented.

In addition, a light blocking layer within one more exemplary embodiment of the electro-wetting display panel and having hydrophilicity is on and extends along the sidewall, and thus overflowing the light blocking layer of a non-conductive fluid (for example, an oil) may be reduced or effectively prevented. In one exemplary embodiment, for example, in injecting the non-conductive fluid into a unit pixel area of an electro-wetting display apparatus or driving the electro-wetting display apparatus, movement of the non-conductive fluid into an adjacent unit pixel area may be reduced or effectively prevented.

In addition, a pixel electrode extends along a side surface of the sidewall, and thus the non-conductive fluid may more accurately move toward a portion of the sidewall excluding the pixel electrode. Thus, incorrect movement of the non-conductive fluid and malfunction of the electro-wetting display panel may be reduced or effectively prevented.

The foregoing is illustrative of the invention and is not to be construed as limiting thereof. Although a few exemplary embodiments of the invention have been described, those skilled in the art will readily appreciate that many modifications are possible in the exemplary embodiments without materially departing from the novel teachings and advantages of the invention. Accordingly, all such modifications are intended to be included within the scope of the invention as defined in the claims. In the claims, means-plus-function clauses are intended to cover the structures described herein as performing the recited function and not only structural equivalents but also equivalent structures. Therefore, it is to be understood that the foregoing is illustrative of the invention and is not to be construed as limited to the specific exemplary embodiments disclosed, and that modifies to the disclosed exemplary embodiments, as well as other exemplary embodiments, are intended to be included within the scope of the appended claims. The invention is defined by the following claims, with equivalents of the claims to be included therein.

What is claimed is:

1. A display substrate comprising:
    a base substrate;
    a sidewall on the base substrate and adjacent to a pixel area, wherein the sidewall extends a first distance from the base substrate to a top of the sidewall, and a lateral side surface of the sidewall is between the base substrate and the top of the sidewall;
    a pixel electrode in the pixel area;
    a fluid layer that includes a non-conductive fluid and a conductive fluid at least partially covering the non-conductive fluid, wherein
        a portion of the conductive fluid at least partially covers the top of the sidewall;
        the non-conductive fluid at least partially covers the pixel area,
        a top surface of the non-conductive fluid is at a second distance from the base substrate, and
        the first distance is greater than the second distance;
    a hydrophobic insulating layer at least partially covering the top of the sidewall and the pixel electrode; and
    a hydrophilic light blocking layer, wherein the hydrophilic light blocking layer:
        is hydrophilic with respect to the conductive fluid;
        covers at least a portion of the hydrophobic insulating layer that is disposed on the top of the sidewall and at least a portion of the hydrophobic insulating layer that is disposed on the lateral side surface of the sidewall; and
        is disposed between the sidewall and the portion of the conductive fluid that at least partially covers the top of the sidewall.

2. The display substrate of claim 1, further comprising a switching element electrically connected to:
a gate line and a data line which cross each other, and the pixel electrode,
wherein the sidewall overlaps the gate line, the data line and the switching element.

3. The display substrate of claim 1, wherein the hydrophobic insulating layer comprises:
a barrier layer at least partially covering the sidewall and at least partially covering the pixel electrode; and
a hydrophobic layer at least partially covering the barrier layer.

4. The display substrate of claim 3, wherein the barrier layer comprises silicon oxide (SiOx) or silicon nitride (SiNx).

5. The display substrate of claim 1, wherein
the sidewall comprises an organic material, and
the hydrophilic light blocking layer comprises chromium or chromium oxide.

6. The display substrate of claim 1, wherein the hydrophilic light blocking layer covers the entire top of the sidewall.

7. The display substrate of claim 1, wherein the pixel electrode is on the side surface of the sidewall or on the top of the sidewall.

8. The display substrate of claim 1, wherein the sidewall comprises:
a first sidewall portion on the base substrate; and
a second sidewall portion on the first sidewall portion, and forming a stepped portion with the first sidewall portion.

9. The display substrate of claim 8, wherein the hydrophilic light blocking layer is on an upper surface of the first sidewall portion, a side surface of the second sidewall portion and an upper surface of the second sidewall portion.

10. The display substrate of claim 8, wherein the pixel electrode is on a side surface of the first sidewall portion, an upper surface of the first sidewall portion, a side surface of the second sidewall portion and an upper surface of the second sidewall portion.

11. A method for manufacturing a display substrate, the method comprising:
providing a sidewall on a base substrate so that the sidewall extends a particular distance from the base substrate to a top surface, the sidewall having a lateral side surface between the base substrate and the top surface of the sidewall, the sidewall being adjacent to a pixel area;
providing a pixel electrode in the pixel area;
at least partially covering the pixel electrode and the top surface of the sidewall with a hydrophobic insulating layer;
at least partially covering the hydrophobic insulating layer and the top surface of the sidewall with a fluid layer that includes an electrolyte solution; and
providing a hydrophilic light blocking layer:
at least partially covering the hydrophobic insulating layer on the top surface,
at least partially covering the hydrophobic insulating layer on the lateral side surface of the sidewall, and
disposed between the top surface of the sidewall and the fluid layer, wherein the hydrophilic light blocking layer is hydrophilic with respect to the electrolyte solution.

12. The method of claim 11, further comprising providing a switching element on the base substrate, wherein the switching element is electrically connected to a gate line, a data line which crosses the gate line, and the pixel electrode, and wherein providing the sidewall comprises:
providing an organic layer on the gate line, the data line and the switching element; and
patterning the organic layer to form the sidewall that overlaps the gate line, the data line and the switching element.

13. The method of claim 12, wherein providing the hydrophilic light blocking layer comprises:
providing a metal layer on the hydrophobic insulating layer; and
patterning the metal layer to form the hydrophilic light blocking layer overlapping the top surface of the sidewall.

14. The method of claim 13, wherein providing the pixel electrode comprises:
providing an electrode layer on the sidewall; and
patterning the electrode layer to:
form the pixel electrode on the lateral side surface of the sidewall or the top surface of the sidewall, and
be electrically connected to the switching element.

15. The method of claim 12, wherein the patterning the organic layer comprises using a slit mask or a half-tone mask to form the sidewall comprising a stepped portion.

16. The method of claim 15, wherein providing the hydrophilic light blocking layer comprises:
providing a metal layer on the hydrophobic insulating layer; and
patterning the metal layer to form the hydrophilic light blocking layer overlapping the stepped portion of the sidewall and the top surface of the sidewall.

17. The method of claim 16, wherein providing the pixel electrode comprises:
providing an electrode layer on the sidewall; and
patterning the electrode layer to:
form the pixel electrode on the side surface of the sidewall comprising the stepped portion and the top surface of the sidewall comprising the stepped portion, and
be electrically connected to a drain electrode of the switching element.

18. The method of claim 11, wherein providing the hydrophobic insulating layer comprises:
forming a barrier layer on the sidewall and the pixel electrode; and
forming a hydrophobic layer on the barrier layer.

19. An electro-wetting display apparatus comprising:
a first substrate;
a second substrate facing the first substrate; and
a fluidic layer between the first substrate and the second substrate, and comprising first and second fluids having specific gravities different from each other,
wherein the first substrate includes:
a sidewall adjacent to a pixel area, wherein the sidewall extends a first distance from the first substrate to a top surface of the sidewall, and wherein the sidewall includes a lateral side surface extending between the first substrate and the top surface of the sidewall;
a pixel electrode in the pixel area;
a hydrophobic insulating layer at least partially covering the top of the sidewall and the pixel electrode and between the second substrate and the top of the sidewall; and
a hydrophilic light blocking layer on at least a portion of the hydrophobic insulating layer that is disposed on the top of the sidewall and at least a portion of the hydrophobic insulating layer that is disposed on the lateral side surface of the sidewall,
wherein the hydrophilic light blocking layer is between a portion of the fluidic layer that is over the top of the sidewall and the top of the sidewall.

20. The electro-wetting display apparatus of claim 19, further comprising:
a column spacer disposed on the hydrophilic light blocking layer and between the hydrophilic light blocking layer and the second substrate, wherein the column spacers maintains a cell gap between the display substrate and the second substrate.

* * * * *